(12) United States Patent
Chmelar

(10) Patent No.: US 7,779,320 B2
(45) Date of Patent: Aug. 17, 2010

(54) LOW POWER SCAN SHIFTING WITH RANDOM-LIKE TEST PATTERNS

(75) Inventor: Erik Chmelar, Midland, MI (US)

(73) Assignee: LSI Corporation, Milpitas, CA (US)

( * ) Notice: Subject to any disclaimer, the term of this patent is extended or adjusted under 35 U.S.C. 154(b) by 318 days.

(21) Appl. No.: 12/070,761

(22) Filed: Feb. 21, 2008

(65) Prior Publication Data

US 2009/0217117 A1 Aug. 27, 2009

(51) Int. Cl.
*G01R 31/28* (2006.01)
*G06F 11/00* (2006.01)

(52) U.S. Cl. .................... 714/726; 714/741

(58) Field of Classification Search .............. 714/726, 714/727, 729, 741
See application file for complete search history.

(56) References Cited

U.S. PATENT DOCUMENTS

| | | | | |
|---|---|---|---|---|
| 6,986,090 | B2 * | 1/2006 | Hathaway et al. | 714/727 |
| 7,428,681 | B2 * | 9/2008 | Kang et al. | 714/738 |
| 7,647,540 | B2 * | 1/2010 | Rajski et al. | 714/738 |
| 2008/0235543 | A1 * | 9/2008 | Wen et al. | 714/724 |

OTHER PUBLICATIONS

Butler et al., "Minimizing Power Consumption in Scan Testing: Pattern Generation and DFT Techniques," Proc. 1TC, pp. 355-364 (2004).*
Wen et al., "Low-Capture-Power Test Generation for Scan-Based At-Speed Testing," Proc. ITC, pp. 1-10 (Nov. 2005).*
Wang et al., LT-RTPG: A New Test-Per-Scan BIST TPG for Low Heat Dissipation, Proc. ITC, pp. 85-94 (1999).*
Li et al., "On Reducing Peak Current and Power During Test," Proc. IEEE Computer Society Annual Symp. on VLSI, 6 pp. (May 2005).*
Ozgur Sinanoglu, et al., Aggressive Test Power Reduction Through Test Stimuli Transformation, 2003, pp. 1-6, Publisher: IEEE, Published in: US.
Xiaoqing Wen, et al., A New ATPG Method for Efficient Capture Power Reduction During Scan Testing, 2006, pp. 1-6, Publisher: IEEE, Published in: US.
Ranganathan Sankaralingam, et al., Controlling Peak Power During Scan Testing, 2002, pp. 1-7, Publisher: IEEE, Published in: US.
Y. Bonhomme, Design of Routing-Constrained Low Power Scan Chains, 2004, pp. 1-6, Publisher: IEEE, Published in: France.

(Continued)

*Primary Examiner*—Cynthia Britt
(74) *Attorney, Agent, or Firm*—Suiter Swantz pc llo

(57) ABSTRACT

An apparatus and method to design an integrated circuit (IC) to reduce the toggling during shifting in and shifting out of test patterns in a IC having scan chains, while maintaining random-like filling of the "don't cares" of a test set. An average pattern of test patterns of a test set is found for both cases of where the test set is fully specified and not fully specified, inverters are judiciously inserted into the scan path and each test pattern is then modified by XOR-ing it with the average test pattern to produce a modified test pattern, which produces less toggling, translating to less power consumption. Further, the random filling of don't cares, as opposed to 0-fill, 1-fill, or adjacent fill, increases defect detection through collateral coverage.

19 Claims, 5 Drawing Sheets

OTHER PUBLICATIONS

Shalini Ghosh, et al., Joint Minimization of Power and Area in Scan Testing by Scan Cell Reordering, 2003, pp. 1-4, Publisher: IEEE, Published in: US.

M. Bellos, et al., Low Power Testing by Test Vector Ordering with Vector Repetition, 2004, pp. 1-6, Publisher: IEEE, Published in: Greece.

Stefan Gerstendorfer, et al., Minimized Power Consumption for Scan-Based BIST, 1999, pp. 77-84, Publisher: University of Stuttgart, Published in: Germany.

Ozgur Sinanoglu, et al., A Novel Scan Architecture for Power-Efficient, Rapid Test, 2002, pp. 299-303, Publisher: University of California, Published in: US.

Xiaoqing Wen, et al., On Low-Capture-Power Test Generation for Scan Testing, 2005, pp. 1-6, Publisher: IEEE, Published in: US.

Sudhakar M. Reddy, et al., On Reducing Peak Current and Power During Test, 2005, pp. 1-6, Publisher: IEEE, Published in: US.

Minsik Cho, et al., Peakaso: Peak-Temperature Aware Scan-Vector Optimization, 2006, pp. 1-6, Publisher: University of Texas at Austin, Published in: US.

Xiaodong Zhang, et al., Power Reduction in Test-Per-Scan BIST, 2000, pp. 1-6, Published in: US.

Y. Bonhomme, Power Driven Chaining of Flip-Flops in Scan Architectures, 2002, pp. 796-803, Publisher: University of Montpellier, Published in: France.

P. Girard, et al., Reducing Power Consumption During Test Application by Test Vector Ordering, 1998, pp. 296-299, Publisher: University Montpellier, Published in: France.

Vinay Dabholkar, et al., Techniques for Minimizing Power Dissipation in Scan and Combinational Circuits During Test Application, IEEE Transactions on Computer-Aided Design of Integrated Circuits and Systems, Dec. 1998, Page(s).

Ozgur Sinanoglu, Test Power Reduction Through Minimization of Scan Chain Transitions, 2002, pp. 1-6, Publisher: University of California, Published in: US.

Ozgur Sinanoglu, et al., Test Power Reductions Through Computationally Efficient, Decoupled Scan Chain Modifications, IEEE Transactions on Reliability, Jun. 2, 2005, pp. 215-223, vol. 54, No. 2.

Seui Kajihara, Test Vector Modification for Power Reduction During Scan Testing, 2002, pp. 1-6, Publisher: Kyushu Institute of Technology, Published in: Japan.

* cited by examiner

| Pattern Number | Pattern |
|---|---|
| 1 | 0 0 1 0 |
| 2 | 1 0 0 0 |
| 3 | 0 1 0 1 |
| 4 | 1 0 0 1 |
| 5 | 1 0 1 1 |
| 6 | 1 1 1 1 |
| Sum 0: | 2 4 3 2 |
| Sum 1: | 4 2 3 4 |
| Sum x: | 0 0 0 0 |
| Average Pattern: | 1 0 y 1 |

*FIG. 2a*

| Pattern Number | Pattern |
|---|---|
| 1 | 0 x 1 0 |
| 2 | 1 0 x 0 |
| 3 | 0 1 x 1 |
| 4 | 1 x 0 1 |
| 5 | 1 0 1 1 |
| 6 | 1 1 x x |
| Sum 0: | 2 2 1 2 |
| Sum 1: | 4 2 2 3 |
| Sum x: | 0 2 3 1 |
| Average Pattern: | 1 y x 1 |

*FIG. 2b*

| Pattern Number | Pattern |
|---|---|
| (Input) 1 | 0 x 1 0 |
| (Output) 2 | 1 0 x 0 |
| (Input) 3 | 0 1 x 1 |
| (Output) 4 | 1 x 0 1 |
| (Input) 5 | 1 0 1 1 |
| (Output) 6 | 1 1 x x |
| Sum 0: | 2 2 1 2 |
| Sum 1: | 4 2 2 3 |
| Sum x (Input Only): | 0 1 1 0 |
| Average Pattern: | 1 y 1 1 |

*FIG. 3*

LOW POWER SCAN SHIFTING WITH RANDOM-LIKE TEST PATTERNS

CROSS-REFERENCE TO RELATED APPLICATIONS

[none]

BACKGROUND OF THE INVENTION

1. Field of Invention

The present invention relates generally to the field of testing of semiconductor logic, in particular to scan chain testing.

2. Description of Related Art

Fabrication of microchips inherently introduces defects into some percentage of manufactured devices, which necessitates a thorough test of the chips to ensure defective devices are not shipped. In a scan-based design of a microchip, test data is input to the microchip when in test mode, and the output is observed and compared to a predicted output. Registers, such as flip-flops or latches, are connected in one or more scan chains, which are used to gain access to internal nodes of the microchip. Test patterns are shifted into the microchip via the scan chain(s), with clock signals pulsed to test the circuit during the "capture cycle(s)." The results of the capture cycles are then shifted out to the microchip output pins and compared against predicted results. Variance between actual output and predicted output indicates a failure.

Thus the most prevalent test architecture is scan path, wherein the flip-flops of the circuit of the microchip are chained together or stitched to form one or more scan chains. There are two methods of implementing scan path: partial scan, wherein only a subset of flip-flops are chained together, and full scan, wherein all relevant flip-flops are chained together. Each flip-flop that becomes part of a scan chain is called a scan flip-flop.

Using the scan path architecture, the state of every scan flip-flop can be set to a desired value simply by shifting in a particular test pattern, or test vector. Thus, test of the complicated sequential design of a microchip is reduced to shifting in a test pattern, testing combinationally, and then shifting out the response.

An unfortunate result of using prior art scan path architecture to test a device is excess power consumption and often increased temperature beyond normal levels achieved during functional mode. Shifting data into the scan chains causes an excessive amount of switching, or toggling, of circuit nodes, much greater than the switching level achieved during functional mode. Excess power and temperature during test can cause good devices to fail and can reduce device reliability.

Excess power consumption is further aggravated by routine test optimizations aimed to reduce test cost and increase test coverage. Shifting in each test pattern is a slow process due to the length of the scan chains. For example, given a design with 500K flip-flops that make up 32 scan chains, there are 500K/32=16K flip-flops per scan chain, meaning it takes 16K clock cycles to shift in a single test pattern. Typical test sets consist of tens of thousands of such patterns. To reduce test cost (tester memory requirements and test time), compaction and compression is used to reduce the total number of test patterns, but this increases the switching activity caused by each test pattern. Furthermore, the data is shifted into the scan chains at as high a clock frequency as possible (albeit this clock frequency is much lower than the functional clock frequency due to the unoptimized scan paths).

At times, bits that need not be specified in a given test pattern to detect the targeted fault or faults, called "don't care" bits, are filled with random values to increase the amount of toggling that occurs when the test pattern is combinationally applied to the circuit. It is well known that such random filling helps detect more defects, specifically defects that are otherwise untargeted or undetectable under the fault model used to generate the test patterns. Such fortuitous defect detection is called collateral coverage.

Regarding test power, there are many things to consider when talking about power consumption during test. Peak power consumption is important when power and ground lines are sized to handle peak power drawn by the device during functional mode. If peak power consumption during test exceeds the rating of the power and ground lines, large current spikes can flow that damage the device. Average power consumption is important when packaging and heat dissipation ability is determined by the functional mode switching, or activity levels. If the activity levels during test exceed the levels expected during functional mode, the device can overheat and damage can occur.

There are two periods of increased activity during test: 1) shifting in test patterns and shifting out responses (generically called shifting), and 2) capturing test responses. Reducing power consumption during capture is a relatively new concept, which primarily relies mostly on filling the don't care bits in a given test pattern—those bits whose values are irrelevant in detecting the targeted fault or faults—such that fewer circuit nodes switch during capture. It was also shown in Wen et al., "A New ATPG Method For Efficient Capture Power Reduction During Scan Testing," Proc. VLSI Test Symp., pp. 58-63, (2006), that test patterns can be generated with switching activity in mind to reduce capture power consumption.

Besides the obvious method of decreasing the shift clock frequency, there are several methods to decrease the power consumption during shifting. The order in which the scan flip-flops are stitched together to form scan chains can be altered. Test patterns can be reordered according to the switching activity caused by each pattern. The don't care bits in a given test pattern can be filled such that fewer flip-flops change state during shifting (for example all-zero fill, all-one fill, last-specified-bit-value fill, etc.). Scan chains whose flip-flop values are unimportant for detecting a particular targeted fault or faults, or whose flip-flop values need not be updated, can be frozen, or turned off, during shifting. Finally, logic gates can be inserted on the scan paths (and the test patterns modified accordingly) such that fewer flip-flops change state during shifting.

Not only is excess power consumed by toggling of scan flip-flops, but the combinational logic connected to the Q output of each flip-flop may also toggle. Thus, logic gates can be inserted on the functional path (Q output) to block switching activity from propagating to the combinational logic. However, the added logic gate or multiplexer on the functional path, called blocking logic, increases the delay of the functional path, which is undesirable.

What is lacking in the prior art is a method and apparatus for an improved process to minimize the toggling during shifting in and shifting out of test patterns, and at the same time keep the randomness of the "don't care" bits of the test pattern, to decrease shift power and increase collateral coverage, such as taught in the present invention.

SUMMARY OF THE INVENTION

Accordingly, an aspect of the present invention is a method to minimize the toggling during shifting in and shifting out of test patterns in a scan chain, by filling the "don't cares" of a test set with values that appear random within a single test pattern.

A further aspect of the present invention is a method of determining an average pattern for a group of test patterns.

Yet another aspect of the present invention is a method of inserting inverters on a scan path during design of a circuit to achieve the objectives of the present invention.

Another aspect of the present invention is a method for modifying each test pattern after inverters have been inserted into the scan path to achieve the proper test pattern.

Another aspect of the present invention is to test the methodology of the present invention to ascertain the degree of shift power and collateral coverage.

Hence the present invention is a process to reduce the toggling during shifting in and shifting out of test patterns while maintaining random-like filling of don't cares. Since the amount of toggling is proportional to the power consumption during shifting, less toggling translates to less power consumption. Finally, the random filling of don't cares, as opposed to 0-fill, 1-fill, or adjacent fill, increases defect detection.

The sum total of all of the above advantages, as well as the numerous other advantages disclosed and inherent from the invention described herein, creates an improvement over prior techniques.

The above described and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings. Disclosed herein is a detailed description of the best presently known mode of carrying out the invention. This description is not to be taken in a limiting sense, but is made merely for the purpose of illustrating the general principles of the invention. The section titles and overall organization of the present detailed description are for the purpose of convenience only and are not intended to limit the present invention.

FIGS. 2(a) and 2(b) illustrates an example for finding the average test pattern for a group of test patterns used on a scan chain in accordance with the present invention.

FIG. 3 illustrates an example of finding the average pattern for a test set used on a scan chain in accordance with the present invention.

Figure 1:
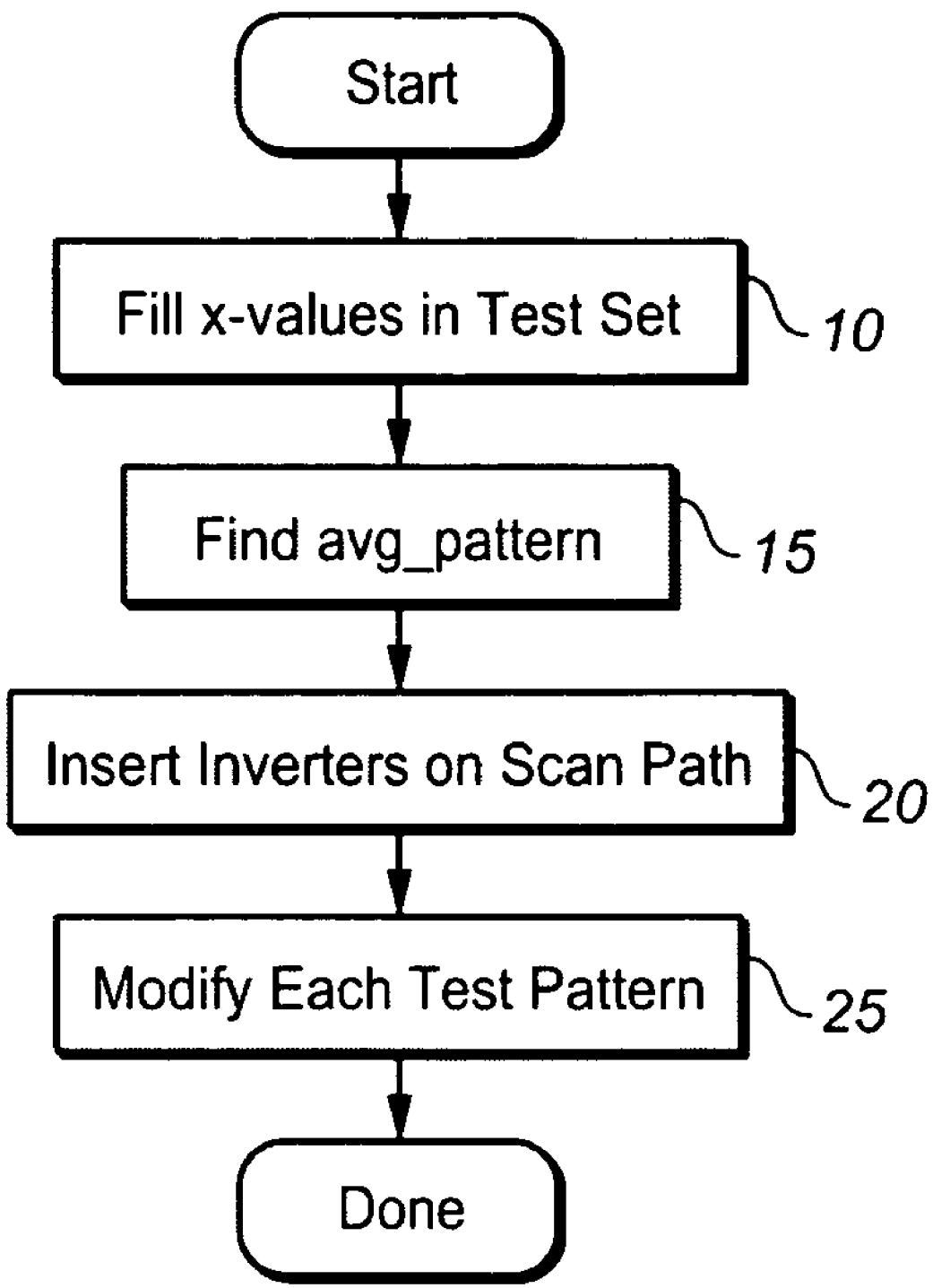
FIG. 1 is a basic flowchart for achieving the present invention.

It should be understood that one skilled in the art may, using the teachings of the present invention, vary embodiments shown in the drawings without departing from the spirit of the invention herein. In the figures, elements with like numbered reference numbers in different figures indicate the presence of previously defined identical elements.

DETAILED DESCRIPTION OF THE INVENTION

The present invention is a method to insert logic gates on the scan paths and modify the test patterns used in these scan paths accordingly, to simultaneously reduce the amount of toggling during shifting and increase the randomness of the "don't care" bits of each test pattern, and the resulting apparatus achieved by such method when constructing and designing an integrated circuit (IC) such as an ASIC, using the methodology of logical and physical design to meet all timing and power constraints. By reducing the amount of toggling during shifting, the shift power is reduced. By increasing the randomness of the "don't care" bits within a test pattern, the collateral coverage is increased and more defective chips are detected. Reducing the amount of toggling and/or increasing the collateral coverage can be termed modifying the scan path, or scan path modification, that reduces the shift power and/or increases collateral coverage over a scan path that is designed without the benefit of the present invention. Essentially the technique of the present invention eliminates the correlation of filled "don't care" bits within a test pattern and adds correlation of filled "don't care" bits between test patterns.

Unlike the techniques of the prior art that account for toggling only during shifting in of test patterns, the present invention accounts for both toggling during shifting in and shifting out (because realistically shifting in and shifting out cannot be decoupled). Additionally, the present invention uses only the negation operation for inserted logic gates, thereby eliminating any routing overhead.

Adding logic instead to the scan paths can be used to reduce the toggle frequency during shifting. It was shown in the prior art, in particular Sinanoglu et al. "Test Power Reduction Through Minimization Of Scan Chain Transitions," Proc. 20th VLSI Test Symp., pp. 161-171, April 2002, that the toggle frequency can be significantly reduced by adding inverter, XOR, and XNOR gates to the scan paths.

Unfortunately, the technique of the prior art such as Sinanoglu et al. accounts only for the shifting in of the test patterns and not the shifting out. In actual operation, when a pattern is shifted into a scan chain, the circuit response to the previous pattern (capture) is shifted out at the same time. Unless a dummy all-zeros or all-ones pattern is shifted into the scan chain after each capture, which would double the test length and test time, it is impossible to decouple shifting in from shifting out.

The technique of the prior art such as Sinanoglu et al. adds circuit area overhead by using large XOR and XNOR gates. Further, the feed-forward loops from scan cells when XOR or XNOR gates are present adds to the total number of nets in the circuit and can cause routing congestion. The technique of the prior art can be modified to use only inverters, but it still suffers from the input/output decoupling problem.

In a preferred embodiment, the method and apparatus of the present invention can employ a mainframe or personal computer to run any software tool that incorporates the invention, and in general any compatible piece of hardware or virtual machine can run the present invention, in particular during the logical and physical design of a circuit such as an ASIC. Thus a preferred method and apparatus of the present invention is a computing platform running a software tool, which can accept human input, and may be written in any computer language (such as C, C++, Perl, Java or the like), including an Object Oriented programming (OOP) language, run by a computer system having an operating system. The computer system typically has one or more processors, primary and secondary memory cooperating with the processor(s), which executes instructions stored in the memory, I/O means such as monitor, mouse and keyboard, and any necessary specialized hardware or firmware. Depending on the language used to construct and implement the software tool, the object code of the tool may have any number of classes, functions, objects, variables, templates, lines of code, portions of code and constructs (collectively and generally, "a process step", "step", "block", "method", "module", "functional module" or "software module") to carry out the invention in successive stages as described and taught herein, and may be either a standalone software application, or employed inside of or called by another software application, or as firmware. The software process or software module may be constructed so that one portion of code in the application performs a plurality of functions, as for instance in Object Oriented programming (e.g., an overloaded process). The converse is also true, in that a plurality of portions of code could perform a plurality of functions, and still be functionally the same as a single portion of code. At any stage of the process step of the present invention, intermediate values, variables and data may be stored for later use by the program.

Turning attention now to FIG. 1, the present invention is a process to minimize the toggling during shifting in and shifting out of test patterns by filling the "don't cares" of a test set with values that appear random within a single test pattern. First, after starting, as indicated by step 10, the box labeled "Fill x-values in Test Set", each "don't care" bit of the test set is filled as a function of the value of the same bit in the other test patterns. Next, as indicated by step 15, the box labeled "Find avg_pattern", an average pattern is found that is most similar to all test patterns in the test set. The first two steps, steps 20 and 25, are related in achieving the same goal of finding an average test pattern that is being applied to the scan chain under consideration, and can be termed the average pattern determining step, though each step has its own methods and methodology, and step 15 sometimes does not require x-values to be filled, depending on whether test sets are fully specified or not, as explained further herein. Further, as indicated in step 20, the box labeled "Insert Inverters on Scan Path", inverters are inserted onto the scan path (or the scan path signals are otherwise inverted) according to this average pattern found in the previous step 15. This step 20 can be termed the scan path inverter insertion step, whether or not actual physical inverters are used, or otherwise, as explained below, and is done during the logical and physical design of the circuit under consideration. Finally, as indicated in step 25, the box labeled "Modify Each Test Pattern", each test pattern is modified to account for the inverters on the scan path, which can be termed the test set modification step, and the process is done. FIG. 1 is a methodology that can be incorporated into any circuit design, such as ASIC logical and physical design.

Regarding step 15 in FIG. 1, one must find an average pattern that is most similar to all test patterns in a scan chain test set, given a group of test patterns. This can be done in a variety of ways, one of which is, for example, the number of 0s, 1s, and xs (don't cares, plural) in each bit position can be summed, and then the value of each bit of the average pattern is 0, 1, or x, depending on which has the largest sum. Alternatively, the average pattern could be found by minimizing a function of Hamming distance between this new test pattern and all test patterns of the group. Although various alternative implementations are also possible, the technique presented in a preferred embodiment will use the first method, summing each bit position, to find the average test pattern for ease of illustration, but this does not in any way preclude the use of other averaging techniques, as can be appreciated by a skilled artisan from the teachings herein.

Thus, turning to FIG. 2(a), there is shown a simple group of 6 test patterns. The sum of 0s, 1s, and xs is tallied (here, because each test pattern is fully specified, there are no xs). The average pattern can be found by the software running the present invention by assigning to an average pattern the value of 0 or 1 (that is, one of either 0 or 1) in each bit in the average pattern, depending on which value of 0 or 1 has the largest sum for each bit position over the group of test patterns, as can be seen by inspection in the figure. In the event of an equal sum, for example the third column from the left has three (3) 0s and three (3) 1s, either 0 or 1 can be chosen as the value of the bit for the third bit position of the average pattern (it is shown as 'y' in FIG. 2(a)). Thus, the average pattern for this group of test patterns would be either 1001 or 1011.

FIG. 2(b) shows another simple group of 6 test patterns with "don't care" bits shown as xs. The sum of 0s, 1s, and xs are tallied, however, only the sum of 0s and 1s is important is finding the average pattern because the xs can be assigned arbitrarily. For example, in the third column from the left the sum of 0s is 1, sum of 1s is 2, and sum of xs is 3. In this case, the sum of 1s is greatest, so the xs would be replaced with 1s to make the sum of 1s: 2+3=5. Thus, the average pattern for this group of test patterns would be 1011 or 1111. Hence the "don't care" xs can be either of 0s and 1s, depending on which is greater in each bit position of the group of test patterns.

Turning attention to FIG. 3, another example for finding the average pattern for a test set, this figure again is a simple example illustrating the basic concept of finding an average pattern for a group of test patterns. It should be borne in mind, however, that a test set has both input and output test patterns, a distinction that is not always made in these simple examples. Although it is not an issue for a fully specified test set, where there are no "don't cares" in either the input or output patterns, in a test set that has "don't cares" in the output test patterns, the "don't care" values in the output test patterns cannot be arbitrarily chosen; the "don't care" values in the output test patterns must be assigned based on logic simulation of the circuit to which the test set applies, after the input pattern bits have been specified. Therefore, the combined input and output 0s and 1s can be summed, but only the xs from input test patterns can be summed to find an average pattern. Given the test set of FIG. 3 and accounting for both input and output patterns, as can be seen by inspection, the average pattern would be 1y11, where each y is either 0 or 1, since y can be either 0 or 1 because the same number of 0s and 1s exist for the second column from the left. Note that output "don't cares" xs are not counted to find the average pattern, only the input "don't care" xs matter. However, as will be explained further below, at some point the circuit must be logic simulated to produce the 0 or 1 logic values of these output xs, based on the 0 or 1 logic values of the input xs.

Figure 4:
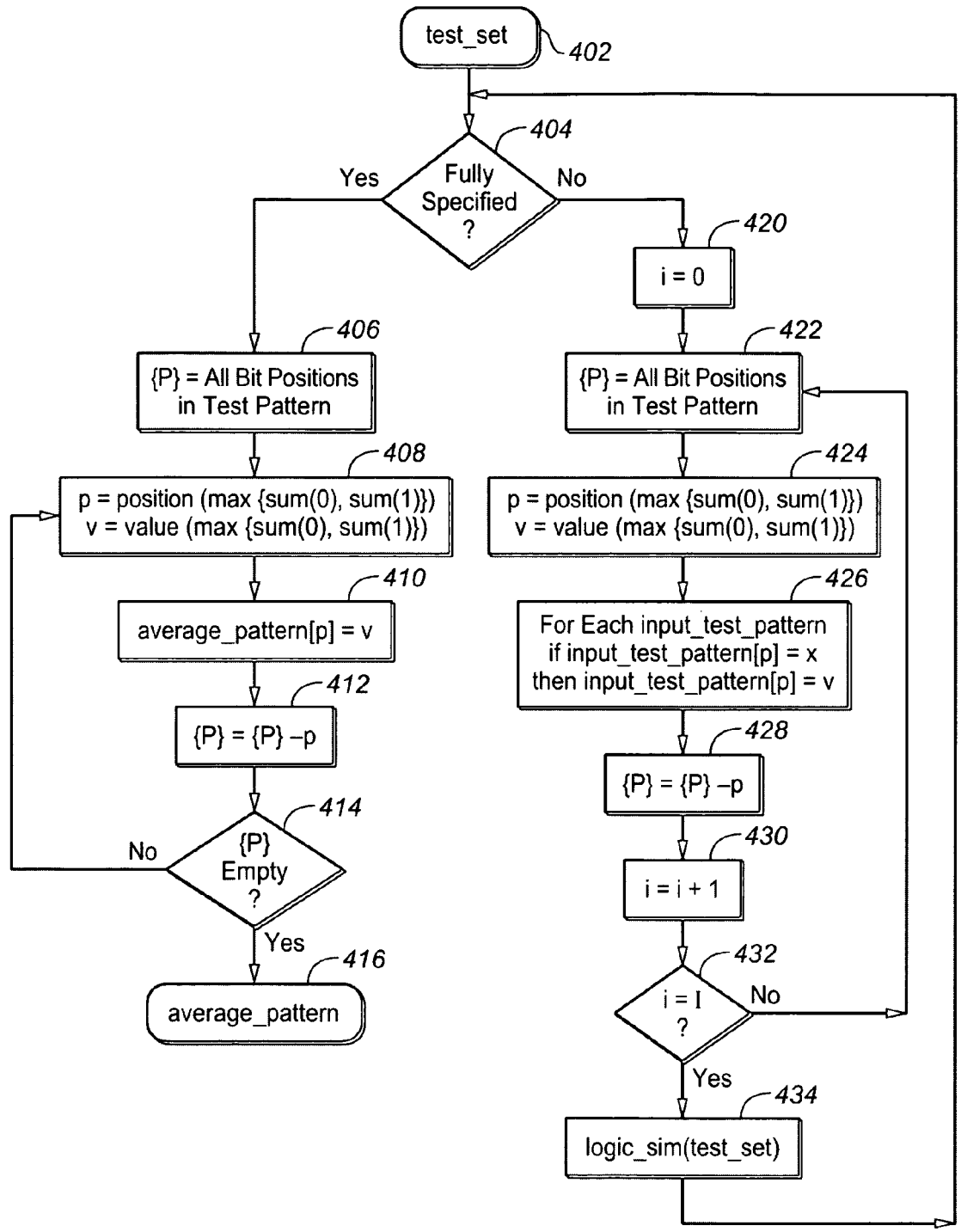
FIG. 4 is a flowchart for finding the average pattern for a test set used on a scan chain in accordance with the present invention.

Thus, turning attention now to logic simulation, the flowchart of FIG. 4 shows a general way to find the average pattern of a given test set in the simple manner chosen for the present invention, with or without a fully specified test set, as per the average pattern determining step, steps 10 and 15 in FIG. 1. It is possible to employ hardware or software to implement the flowchart of FIG. 4, such as in a circuit design. In general, whenever an x-value of an input test pattern is filled with a 0 or 1, the test pattern must be logic simulated to propagate any response of the filled bit to x-value bits of the corresponding output test pattern.

The process of finding the average pattern begins at the top of FIG. 4, at the box step 402 labeled 'test_set'. Given a test set with N patterns each P bits long, the test set can be viewed as a N×P matrix (N rows, P columns) as was shown in the examples of FIG. 2 and FIG. 3. The average pattern has P bits, one bit for each column P. Let the function "position(arg)", in FIG. 4, (with 'arg' equal to some function argument values, e.g., arg=max {sum(0), sum(1)} in FIG. 4), return the column index, or position, p, of the argument 'arg', and let the function "value (arg)" return the value, v, of 0, 1, or x of the argument 'arg'. Let the function "sum(0)" sum the total number of 0s in each column P and "sum(1)" sum the total number of 1s in each column P. Thus, if the test set is fully specified (i.e., no x-values), as indicated in decision box step 404 labeled "Fully Specified?", then the average pattern is found simply by assigning for each position p the value v, either 0 or 1, of the maximum summation sum(0) or sum(1) for that bit position, as is indicated by taking the 'yes' branch of decision box 404, and proceeding along the path of steps box 406, labeled "{P}=All Bit Positions In Test Pattern", where P is the bits in the pattern; step box 408, labeled "p=position (max{sum(0),sum(1)}), v=value(max{sum(0), sum(1)})", where p=position or column index and v=value at that position; then step box 410, labeled "average_pattern[p]=v", where the value of the average pattern at position p is found, similar to the example as shown in FIG. 2(a). In step box 412 labeled "{P}={P}−p" the column index is moved in anticipation of the bits being examined again at the new column position. At decision box 414 labeled "{P} empty?" the bit positions in the test pattern are examined to see if one has come to the end of the bits, with no more columns of bits to be examined; if so, the 'yes' branch is taken to step box 416, labeled "average_pattern," and the average pattern is found as per the example of FIG. 2(a), otherwise, if not, the 'no' branch is taken and the process repeats starting at box 408.

On the other hand, if the test set is not fully specified (e.g., 'don't care' x-values present), then the x-values of the input patterns must be chosen and the x-values of the output patterns must be found via logic simulation, with the logic simulation being performed by the standard tools of digital circuit design, as are known per se to one of ordinary skill in the art. This is described in FIG. 4 at the branch labeled 'no' from box 404. A scan chain test vector input pattern comprising of all zeros (which alternatively could be all ones, with the flowchart suitably modified as taught herein) is input into the simulation, as indicated by box step 420, labeled "i=0". In box step 422 labeled "{P}=All Bit Positions In Test Pattern" and step box 424 labeled "p=position(max{sum(0),sum(1)}), v=value(max{sum(0), sum(1)})", one finds among the P columns the column with the maximum summation values sum (0) and sum(1). Next, for the column p with the maximum summation, if sum(0) is greater than sum(1), then replace any x-value (x being a 'don't care' value) at position p in each input pattern with 0, else replace with 1, this is indicated by box step 426 labeled "For Each Input_Test_Pattern if input_test_pattern[p]=x then input_test_pattern[p]=v". Remove column p from further consideration (box step 428 labeled "{P}={P}−p", and repeat the process I−1 times, I>0, with i being a dummy index variable in the iteration loop that is incremented for each loop pass, as indicated by step box 430 labeled "i=i+1" and step decision box 432 labeled "i=I?", then logic simulate the test set, as indicate by box step 434 labeled "logic_sim(test_set)". As indicated by the example of FIG. 3, when "don't cares" are present in the output test patterns of a non-fully specified test set, the value of these output "don't care's" cannot be arbitrarily chosen but must be assigned based on logic simulation of the circuit to which the test set applies. Once logic simulation is performed, these output "don't care's" become known values and can be incorporated into a summing analysis the same as any other 0s and 1s, as taught herein.

Hence, logic simulation can be done after an arbitrary number of iterations, replacing x-values with a 0 or 1. Although it would seem that a more accurate average pattern would result if logic simulation were done after each iteration, this is not necessarily the case, and logic simulation does not have to be performed after each iteration for acceptable accuracy. Thus as shown in the decision diamond step 432 labeled "i=I?", after one or more test patterns from the group of non-fully specified test patterns is analyzed to find the average test pattern for each bit position in the pattern under consideration, the IC being built can be logic simulated to see what the "don't cares" should be for that particular test pattern. However, it is not necessary to perform this logic simulation for every bit position in the test pattern, but rather logic simulation can wait until after each test pattern's bit positions are completed, as indicated in FIG. 4. Though it might be a good idea to logic simulate at the box step 434 labeled "logic_sim(test_Set)" after every test pattern is completed, in fact more than one test pattern could be analyzed before logic simulation is performed, hence, at box 434, the logic simulation is optional for any particular test pattern, though eventually input patterns whose xs are filled will need to be logic simulated at some point to determine what the correct values are to fill the xs in the output patterns.

As is obvious to one of ordinary skill from the teachings herein, many different methods can be used to find the average pattern; with the preferred embodiment disclosed herein being just one method. For example, in the presence of x-values, instead of finding the column p with the maximum summation sum(0) or sum(1), the column with the maximum number of x-values in input patterns can be found, the reasoning being that these x-values are maximally controllable (can be assigned 0 or 1). This can be termed the maximally controllable method or methodology for when x-values are present. Multiple stage x-value replacement can also be done, in which the x-values of a column p are replaced with say 0, the test set is logic simulated, and the sum(0) for that column is found, then the same x-values are replaced with 1 and again the test set is logic simulated, and the sum(1) for that column is found. The x-value replacement that yielded the highest summation after logic simulation would then be chosen for that iteration. This can be termed the multiple stage x-value replacement method or methodology for when x-values are present.

Figure 5:
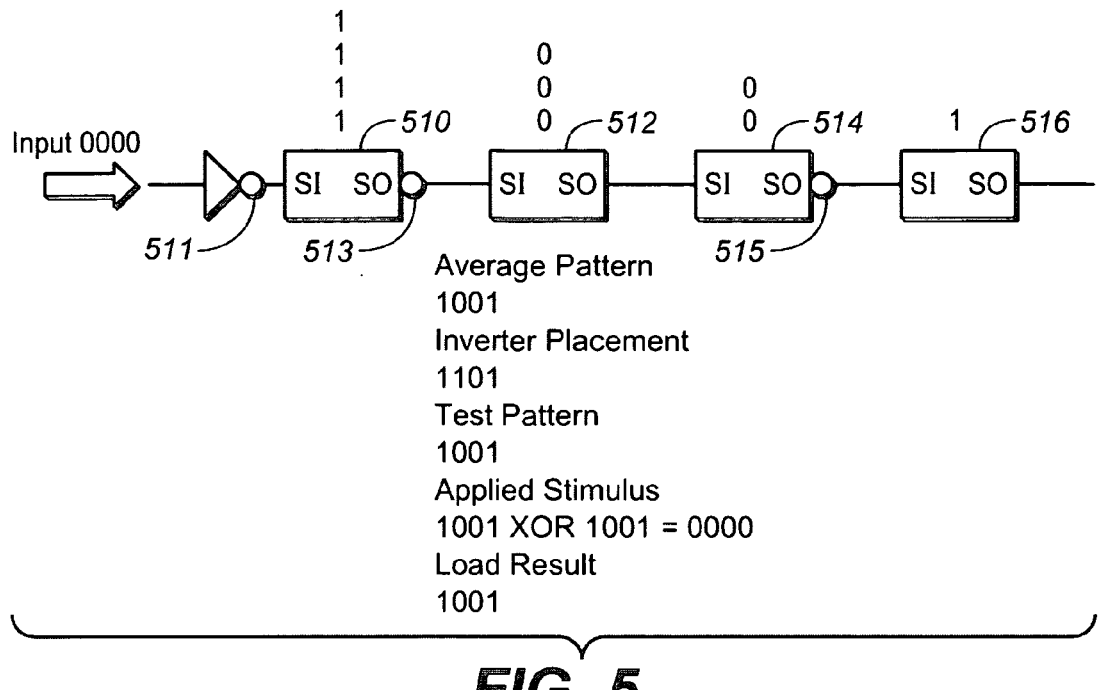
FIG. 5 illustrates how to place inverters in the path of the scan chain to minimize flip-flop toggling when an all zero pattern is input into the scan chain.

As per step 20 in FIG. 1 herein, once the average pattern is found, which is supposed to be a single pattern that is most similar to all patterns in the test set, inverters are placed in the scan path during the circuit logical and physical design, such that if an all-zero pattern were shifted into the scan chains, the result would be that the scan chains were loaded with the average pattern with no flip-flop toggling occurring (alternatively inverters could be placed for all-one pattern shifting;

for purposes of the invention either an all-zero pattern or an all-one pattern will be termed an all-unitary pattern). For example, if the average pattern is found to be 1001, then the software incorporating the present invention would suggest that inverters should be placed before the first, second, and fourth flip-flops, which can be represented as 1101. Thus, if 0000 were shifted in to the scan chain, the scan chain flip-flop values would be 1001—the average pattern. FIG. 5 shows this concept. An input sequence of 0000, the applied stimulus, is shifted to the scan chain with each succeeding clock pulse, and the output of the flip-flops (or equivalently latches) 510, 512, 514, 516 yield the average pattern 1001, only when the inverters 511, 513, 515 are placed in the scan chain in a configuration giving the sequence 1101 over the successive clock pulses, with no inverter needed at the flip-flop 512 output, hence the applied stimulus would be the average pattern XOR'ed with the test pattern, or in the example of FIG. 5, 1001 XOR 1001=0000.

In general, a formula for placing the inverter (for inverting the signal in the scan chain) is as follows: given an average pattern of n bits, $b_1 b_2 \ldots b_n$, an inverter is placed before each flip-flop i in the scan chain if and only if $b_i$ XOR $b_{i-1}$=1 ($b_0$ is 0 by definition). Note that either inverter cells can be placed on the scan paths or simply the Q bar output (negation of the output) of the scan flip-flops can be used to invert their output for the remaining scan flip-flops. Similar techniques aside from negation of the output and insertion of inverter cells may be employed using the teachings herein.

Thus the software module that performs this function in software incorporating the present invention determines where to invert a signal in the scan chain, by using inverters, the Q-bar output of the scan flip-flops, or by any other similar technique, as taught herein.

Figure 6:
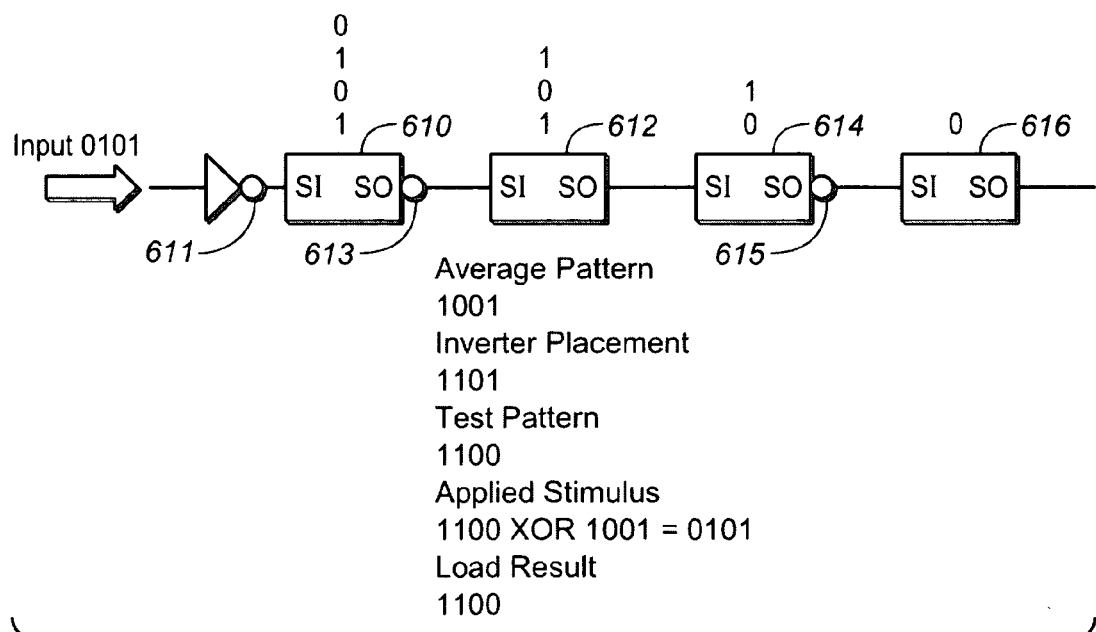
FIG. 6 illustrates how to place inverters in the path of the scan chain to minimize flip-flop toggling when an arbitrary pattern is input into the scan chain.

After inverters are placed on the scan path, with all x-values filled as described above, each pattern of the test set must be altered such that when the pattern is shifted in to the modified scan chains, the result is the loading of the actual test pattern into the flip-flops of the scan chains. Each test pattern is modified according to the average pattern; each test pattern must simply be XOR'ed with the average pattern. For example, if the average pattern were found to be 1001, the test pattern 1100 would be changed to 1001 XOR 1100=0101, and 0101 would be shifted in to the scan chains to result in 1100 being loaded. FIG. 6 shows this concept.

Hence, in FIG. 6, as can be seen by inspection, over successive clock cycles as the scan chain is enabled, the input applied stimulus 0101 corresponds to the test pattern 1100 XOR'ed with the average pattern 1001, with 1100 XOR 1001=0101, and this happens when the inverter placement of inverters 611, 613, 615 is 1101 over flip-flops 610, 612, 614, 616 as shown, with no inverter needed after the flip-flop 612 output.

Figure 7:
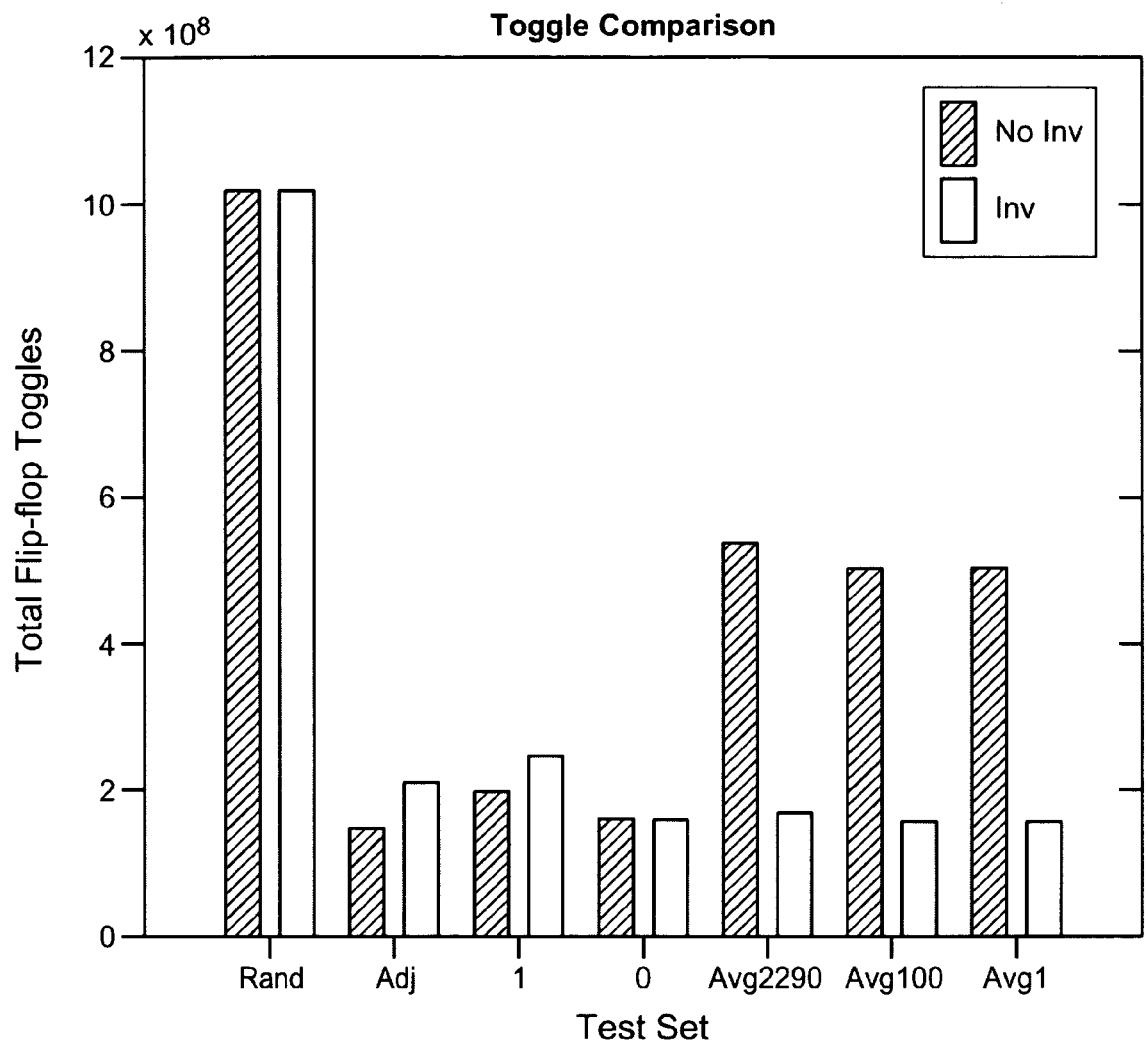
FIG. 7 illustrates experimental results in flip-flop toggles versus prior techniques when practicing the method and apparatus of the present invention.

In the present invention experiments were conducted to show the difference in toggling and the randomness of the values of "don't cares", as shown in FIG. 7. Experiments were conducted on an actual chip design, while implementation of the invention was done by a program written in C, and logic simulation for any non-fully specified test sets was done using the Mentor Graphics program FastScan ATPG. Four different test sets were generated using Automated Test Pattern Generation (ATPG) tools, in which "don't cares" in input patterns were filled by the tool according to a selected algorithm and "don't cares" in output patterns were found by logic simulation. In the first test set, 'Rand', "don't cares" were randomly filled, as indicated in the bar chart labeled 'Rand' in FIG. 7. In the second test set, labeled 'Adj', "don't cares" were filled by adjacent fill, a method wherein each "don't care" bit is replaced by the logic value, either 0 or 1, directly preceding it. In the third and fourth test sets, labeled '1' and '0', "don't cares" were filled with 1, and 0, respectively. All test sets were generated with dynamic compaction of data to minimize the test set size.

The left bar in each group in FIG. 7 shows the amount of toggling when that particular test set is applied to the design (shift-in, capture, and shift-out) without the benefit of inverters being placed in the scan chain and appropriately modifying the test set, as taught by the present invention. It can clearly be seen that random filling "don't cares" results in the highest amount of toggling during shifting, which results in high power consumption. However, it is well known that the degree of randomness in values of the don't care bits is beneficial for increased defect detection. As can be seen from inspection, adjacent filling "don't cares" resulted in the least amount of toggling.

The process outlined in the present invention was used to find the average pattern for each of the four ATPG-don't-care-filled test sets, insert inverters on the scan path, and modify the test set to account for the inverters. The right bar in each group in FIG. 7 shows the amount of toggling when that particular test set is applied to a circuit thus designed in accordance with the present invention. It can be seen from FIG. 7 the beneficial change in toggling that resulted, a decrease.

Further regarding FIG. 7, a fifth test set was generated using ATPG without filling the "don't cares" (dynamic compaction was used). The process outlined herein for the present invention was used to fill the don't care bits, find an average pattern, and modify the test set to account for the inverters. The process was done three times, each time varying the number of iterations of filling x-values (column iterations) before logic simulating the test set as outlined in connection with FIG. 4. In FIG. 7, 'Avg2290' was logic simulated after 2290 column iterations (the length of the longest test pattern), 'Avg 100' was logic simulated after 100 column iterations, and 'Avg1' was logic simulated after each column iteration. The left bar in each group in FIG. 7 shows the amount of toggling when that particular test set is applied to the design without inverters inserted onto the scan path and without the test set being modified to account for the inverters. The right bar in each group in FIG. 7 shows the amount of toggling when that particular test set is applied to the design with inverters inserted onto the scan path and with the test set being modified to account for the inverters. It can be seen in FIG. 7 that there is no need for logic simulating after every iteration, as pointed out in connection with FIG. 4, before replacing x-values with a 0 or 1.

As shown in FIG. 7, the value of the process outlined in the present invention can clearly be seen by noting the difference in toggling amount between the left and right bars of FIG. 7 for the three 'avg' test sets, 'Avg2290', 'Avg100' and 'Avg1'. While the left bar shows a high amount of toggling, nearly half that of random fill, the right bar—a result of applying the exact same test set but with average pattern modifications—shows toggling that is very close to the minimum of process 'Adj', adjacent fill. The reduced toggling during shifting with 'random-like' filling of the "don't cares" of the test patterns is clear.

The advantage of the present invention is that the test set that results by filling the "don't cares" as described, finding an average pattern, inserting inverters on the scan path, and modifying the test set to account for these inverters, are low-toggle, random-like test patterns. By reducing the shift toggle amount to the near minimum levels that result by using adjacent-fill, 0-fill, and 1-fill, the power consumption during test is minimized. By filling the "don't cares" with random-like logic values (unlike adjacent-fill, 0-fill, and 1-fill), more defects are expected to be detected simply because the random-like values are better at controlling and observing defects than all-zero or all-one values.

Thus the present invention is a process to reduce the toggling during shifting in and shifting out of test patterns while maintaining random-like filling of don't cares. The amount of toggling is proportional to the power consumption during shifting, thus less toggling translates to less power consumption. The random filling of don't cares, as opposed to 0-fill, 1-fill, or adjacent fill, increases defect detection.

Although the present invention has been described in terms of the preferred embodiments above, numerous modifications and/or additions to the above-described preferred embodiments would be readily apparent to one skilled in the art.

It is intended that the scope of the present invention extends to all such modifications and/or additions and that the scope of the present invention is limited solely by the claims set forth below.

I claim:

1. A computer program product for construction of an integrated circuit (IC) scan chain in an IC, the computer program product including computer code stored on a device, comprising:
    an average pattern determining step module for determining the average pattern for a group of test patterns being input into a scan chain during construction of an IC;
    a scan path inverter insertion step module for determining where to invert the signal for the scan flip-flops in the scan chain; and,
    a test set modifying module for modifying a group of test patterns used in a scan chain to test the IC;
    wherein constructing the IC scan chain according to the average path module, the scan path inverter insertion module and the test set modifying module modifies the scan path and produces a modified test set of patterns.

2. The computer program product according to claim 1, wherein:
    the average pattern determining step module comprises a software module that assigns to an average pattern the value of one of either 0 or 1 in each bit in the average pattern depending on a methodology selected from the group consisting of minimizing a function of Hamming distance between the average pattern and all test patterns of the group of test patterns; the maximally controllable methodology, and the multiple stage x-value replacement methodology.

3. The computer program product according to claim 1, wherein:
    the average pattern determining step module comprises a software module that assigns to an average pattern the value of one of either 0 or 1 in each bit in the average pattern depending on which value of 0 or 1 has the largest sum for each bit position over the group of test patterns.

4. The computer program product according to claim 3, wherein:
    the scan path inverter insertion step module determines where to invert the signal in the scan chain such that when an all-unitary pattern is shifted into the scan chain, a minimum of flip-flop toggling occurs.

5. The computer program product according to claim 4, wherein:
    the test set modifying module alters the group of test patterns after the average pattern is determined by the average pattern determining step module by having each test pattern in the group XOR'ed with the average pattern.

6. The computer program product according to claim 5, wherein:
    the scan path inverter insertion step modules determines where at least one of an inverter and the Q-bar output of a scan flip-flop should be placed in the scan chain to achieve the minimum of flip-flop toggling.

7. The computer program product according to claim 1, wherein:
    the average pattern determining step module comprises a software module that assigns to an average pattern the value of one of either 0 or 1 in each bit in the average pattern depending on which value of 0 or 1 has the largest sum for each bit position over the group of test patterns;
    the group of test patterns are not fully specified, and don't cares are present in output test patterns from the scan flip-flops; and,
    further comprising choosing the values that the don't cares assume based on logic simulation of the IC to which the test patterns apply.

8. The computer program product according to claim 7, wherein:
    the scan path inverter insertion step module determines where to invert the signal in the scan chain such that when an all-unitary pattern is shifted into the scan chain, a minimum of flip-flop toggling occurs, according to the following formula:
    given an average pattern of n bits b, $b_1 b_2 \ldots b_i \ldots b_n$, an inverter is placed before each flip-flop i in the scan chain if and only if $b_i$ XOR $b_{i-1}=1$ (with $b_0=0$), and,
    the signal is inverted in the scan chain by hardware selected from the group consisting of inverter cells or the Q-bar output of the scan flip-flops.

9. The computer program product according to claim 7, wherein:
    the scan path inverter insertion step module determines where to invert the signal in the scan chain such that when an all-unitary pattern is shifted into the scan chain, a minimum of flip-flop toggling occurs; and,
    the test set modifying module alters the group of test patterns after the average pattern is determined by the average pattern determining step module by having each test pattern in the group XOR'ed with the average pattern.

10. The computer program product according to claim 9, wherein:
    the average pattern determining step software module assigns to an average pattern the value of one of either 0 or 1 in each bit in the average pattern depending on a methodology selected from a group consisting of the maximally controllable methodology and the multiple stage x-value replacement methodology.

11. A method for designing an integrated circuit (IC) for testing, the method including steps implemented as instructions stored in memory and executed by a processor, comprising:
    determining the average pattern for a group of test patterns used in a scan chain to test an IC;
    determining where in a scan path the scan path signals leading to scan chain flip-flops must be inverted to achieve the minimum of toggling by the scan flip-flops when an all-unitary pattern is input into the scan chain; and,
    modifying the group of test patterns used in a scan chain to test the IC according to the average pattern;

wherein constructing the IC scan chain according to these steps modifies the scan path and produces a modified set of test patterns.

12. The method according to claim 11, further comprising:
determining the average pattern of the group of test patterns by minimizing a function of Hamming distance between the average pattern and all test patterns of the group of test patterns; and,
altering the test patterns after the average pattern is determined by XOR-ing each test pattern in the group with the average pattern, to produce a new set of test patterns.

13. The method according to claim 11, further comprising:
determining the average pattern of the group of test patterns by assigning to an average pattern the value of one of either 0 or 1 in each bit in the average pattern depending on which value of 0 or 1 has the largest sum for each bit position over the group of test patterns under consideration; and,
altering the test patterns after the average pattern is determined by XOR-ing each test pattern in the group with the average pattern, to produce a new set of test patterns.

14. The method according to claim 11, further comprising:
determining the average pattern of the group of test patterns by assigning to an average pattern the value of one of either 0 or 1 in each bit in the average pattern depending on which value of 0 or 1 has the largest sum for each bit position over the group of test patterns under consideration;
determining the average pattern for the group of test patterns where the group of test patterns are not fully specified, and don't cares are present in output test patterns from the scan flip-flops in the scan chain of the IC.

15. The method according to claim 14, further comprising:
choosing the values that the don't cares assume based on logic simulation of the IC to which the test patterns apply.

16. The method according to claim 15, further comprising:
performing the logic simulation after at least one column iteration of each bit position in at least one test pattern from the group of test patterns is summed for 0s, 1s and xs (don't cares).

17. The method according to claim 16, further comprising:
inverting the scan path signals leading to scan chain flip-flops to achieve the minimum of toggling by the scan flip-flops when an all-unitary pattern is input into the scan chain; and,
altering the test patterns after the average pattern is determined by XOR-ing each test pattern in the group with the average pattern, to produce a new set of test patterns.

18. The method according to claim 14, further comprising:
altering the test patterns after the average pattern is determined by XOR-ing each test pattern in the group with the average pattern, to produce a new set of test patterns;
inverting the scan path signals leading to scan chain flip-flops to achieve the minimum of toggling by the scan flip-flops when an all-unitary pattern is input into the scan chain, wherein said inverting is performed by placing an inverter or the output of the Q-bar of a scan flip-flop, according to the formula:
given an average pattern of n bits b, $b_1 b_2 \ldots b_i \ldots b_n$, an inverter is placed before each flip-flop i in the scan chain if and only if $b_i$ XOR $b_{i-1}=1$ (with $b_0=0$).

19. An apparatus for construction of a semiconductor having an integrated circuit (IC) scan chain comprising:
means for determining an average pattern for a group of test patterns being input into a scan chain during construction of an IC;
means for filling x-values in a group of test patterns;
means for inverting values of a signal for the scan flip-flops in the scan chain; and,
means for modifying a group of test patterns used in a scan chain to test the IC;
wherein constructing the IC scan chain according to the means for determining an average pattern, means for filling x-values, means for inverting, and means for modifying the group of test patterns modifies the original scan path of the IC and produces a modified test set of patterns.

* * * * *